(12) United States Patent
Rodriguez

(10) Patent No.: US 9,510,484 B1
(45) Date of Patent: Nov. 29, 2016

(54) RACK COOLING

(71) Applicant: International Business Machines Corporation, Armonk, NY (US)

(72) Inventor: Jean-Michel Rodriguez, Mauguio (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/936,757

(22) Filed: Nov. 10, 2015

(51) Int. Cl.
*H05K 7/20* (2006.01)
*H05K 7/14* (2006.01)

(52) U.S. Cl.
CPC ........ *H05K 7/20736* (2013.01); *H05K 7/1488* (2013.01); *H05K 7/20745* (2013.01)

(58) Field of Classification Search
CPC .................................. H05K 7/20536–7/20836
USPC .......................................... 361/695; 312/236
See application file for complete search history.

(56) References Cited

U.S. PATENT DOCUMENTS

| | | | |
|---|---|---|---|
| 7,259,963 B2 * | 8/2007 | Germagian | H05K 7/20745 361/690 |
| 7,986,526 B1 * | 7/2011 | Howard | H05K 7/1488 181/200 |
| 8,031,468 B2 | 10/2011 | Bean, Jr. et al. | |
| 8,254,124 B2 * | 8/2012 | Keisling | H05K 7/20827 165/104.33 |
| 8,628,158 B2 | 1/2014 | Caveney | |
| 8,675,357 B2 | 3/2014 | Namek et al. | |
| 8,908,368 B2 | 12/2014 | Campbell | |
| 8,934,242 B2 | 1/2015 | Bean, Jr. et al. | |
| 9,072,193 B1 | 6/2015 | Eichelberg | |
| 2012/0155027 A1* | 6/2012 | Broome | H05K 7/1497 361/696 |
| 2012/0162906 A1* | 6/2012 | Jai | H05K 7/20745 361/679.53 |
| 2013/0120931 A1* | 5/2013 | Sankar | H05K 7/20745 361/679.48 |
| 2014/0331582 A1* | 11/2014 | Klaba | H05K 7/1497 52/234 |

OTHER PUBLICATIONS

Zhou et al., Modeling and Control for Cooling Management of Data Centers with Hot Aisle Containment, Proceedings of the ASME 2011 International Mechanical Engineering Congress & Exposition, IMECE2011, Nov. 11-17, 2011, 8 pages.
Vangilder et al., A Flow-Network Model for Predicting Rack Cooling in Containment Systems, Conference Paper, Jan. 2009, DOI: 10.1115/InterPACK2009-89161, 8 pages.

* cited by examiner

*Primary Examiner* — Zachary M Pape
(74) *Attorney, Agent, or Firm* — Schmeiser, Olsen & Watts, LLP; Isaac Gooshaw

(57) ABSTRACT

A system that includes four racks arranged in a cruciform arrangement having a center, when viewed from above. Each rack has a front and a rear, with the rear of each rack facing the center of the cruciform arrangement. Each rack includes at least two electronic components, a cooling system connected to the rack and arranged to draw cool air into the rack to cool the electronic components and expel hot air from the rack via the rear of the rack, a panel movable from a first position not blocking the rear of an adjacent rack to a second position blocking the rear of the adjacent rack, and a rail system connected to the rack and for moving the rack from an operating position forward to a non-operating position.

10 Claims, 5 Drawing Sheets

RACK COOLING

TECHNICAL FIELD

The present invention relates to cooling a rack of electronic components.

BACKGROUND

Electronic components in a rack generate heat when the electronic components are in an operating environment, and the electronic components are cooled to remove the generated heat.

SUMMARY

According to an embodiment of the present invention, a system comprises four racks arranged in a cruciform arrangement having a center, when viewed from above. Each rack has a front and a rear, with the rear of each rack facing the center of the cruciform arrangement. Each rack includes: a plurality of electronic components; a cooling system connected to the rack and arranged to draw cold air into the rack to cool the electronic components and expel hot air from the rack via the rear of the rack; a panel mounted on each rack of the four racks, movable from a first position not blocking the rear of an adjacent rack to a second position blocking the rear of the adjacent rack; and a rail system connected to the rack and for moving the rack from an operating position forward to a non-operating position.

According to an embodiment of the present invention, a method includes: storing a plurality of electronic components in a system comprising four racks arranged in a cruciform arrangement having a center, when viewed from above, each rack having a front and a rear, with the rear of each rack facing the center of the cruciform arrangement; drawing cooler air into each rack, via a cooling system, to cool the electronic components and expelling warmer air from the rack via the rear of the rack; moving a panel, mounted on each of the four racks, from a first position not blocking the rear of an adjacent rack to a second position blocking the rear of the adjacent rack; and moving the adjacent rack from an operating position forward to a non-operating position with a rail system connected to the adjacent rack.

BRIEF DESCRIPTION OF THE DRAWINGS

Embodiments of the present invention will now be described, by way of example only, with reference to the following drawings.

DETAILED DESCRIPTION

Racks that store electronic components are used in data centers, and the cooling of the electronic components is a major issue in terms of efficiency and cost.

Definitionally, the phrases "cold air" and "hot air" denote relatively cold and hot air, respectively, with respect to each other; i.e., the hot air is at a higher temperature than the cold air. The cold air and hot air are illustrated by cold air 22 and hot air 24, respectively, in FIG. 5.

Figure 1:
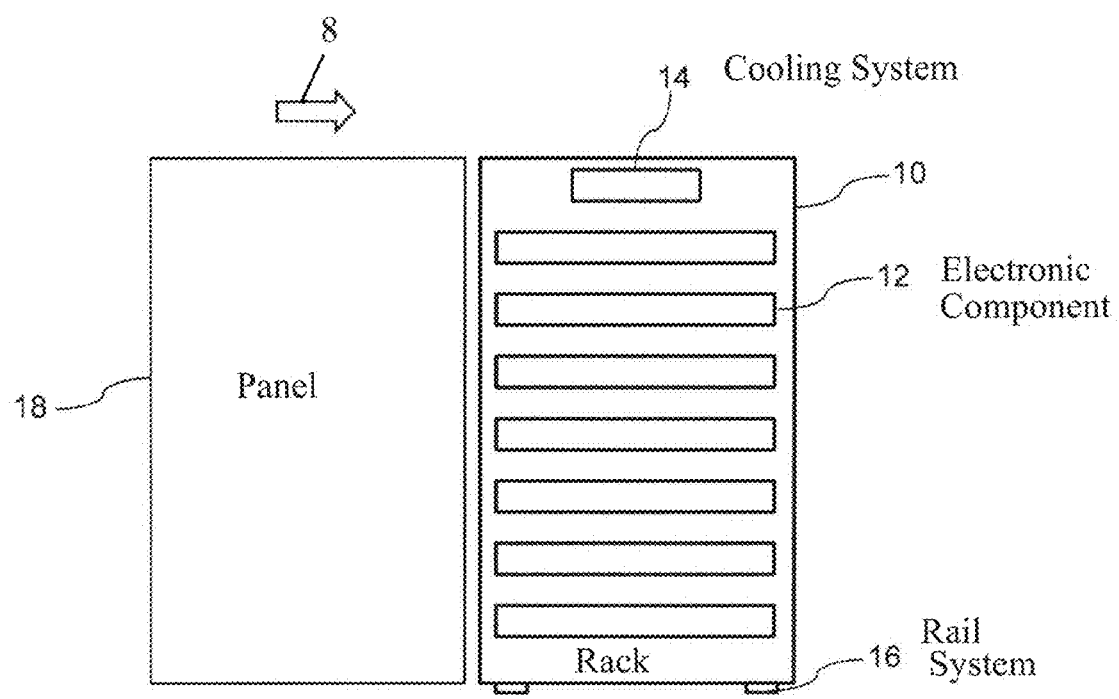
FIG. 1 depicts a schematic diagram of a front view of a rack for storing electronic components, in accordance with embodiments of the present invention.

FIG. 1 depicts a schematic diagram of a front view of a rack 10 for storing electronic components 12, in accordance with embodiments of the present invention. The rack 10 is storing rack electronic components 12, such as server blades. The front of the rack 10 provides direct access to the electronic components 12 and may or may not be provided with a door to close the front access to the rack 10. In this example, no door is present. The rack 10 is of a type commonly found in data centers which provide data storage and processing functions in one location, while also providing associated functions such as physical security, power supply and backup and cooling of the electronic components. The electronic components 12 generate heat and need to be cooled to dissipate the heat.

The rack 10 is provided with a cooling system 14 that is connected to the rack 10 (and located inside the rack 10) and is arranged to draw cold air into the rack 10 to cool the electronic components 12 and expel hot air from the rack 10 via the rear of the rack 10. The cooling system 14 may include a fan that is designed to draw the cold air into the rack 10 from the front of the rack 10, then circulate the cold air over the electronic components 12, and then pass the hot air out of the rack 10 via the back (i.e., rear) of the rack 10. The cold air flowing over the electronic components 12 keeps the electronic components 12 cool by drawing heat away from the electronic components 12. The heat drawn away from the electronic components 12 generates the hot air that passes out of the back of the rack 10.

The rack 10 is also provided with a rail system 16 which is connected to the rack 10 (and located underneath the rack 10). The rail system 16 enables the rack 10 to move from an operating position forward to a non-operating position. The rail system 16 is provided underneath the rack 10, supporting the weight of the rack 10, and facilitates access to the rear of the rack 10, for example for the function of providing maintenance to connections at the back of the rack 10. In a normal operating position, the rack 10 is stationary and can be moved forward to a non-operating position, in order to permit access the rear of the rack 10. A panel 18 from an adjacent rack (see FIG. 2) is movable in a direction 8 from a first position not blocking the rear of the rack 10 to a second position blocking the rear of the rack 10. The panel 18 is mounted on a side of an adjacent rack 10, as explained in more detail with reference to FIGS. 2 and 3 which show top views of four adjacent racks 10 that are located in a cruciform arrangement.

The purpose of the panel 18 is to close off the normal access to a hot area in hot aisle 20 (see FIG. 2) at the back of the rack 10 when the rack 10 is moved forward. The cooling system 14 operates by expelling hot air out from the back of the rack 10, which is then drawn away from the rack 10 via an air conditioning system. The drawn away hot air is to be cooled for re-use as cooling air at the front of the rack 10. Thus, the local atmosphere in the hot area of hot aisle 20 at the rear of the rack 10 is filled with hot air being drawn away, and the panel 18 is moved into position to close off this hot air area before the rack 10 is moved forward.

FIG. 1 shows a single rack 10 in order to illustrate the components that make up the rack 10. In general, there are one or more such racks 10 in the same data center. The configuration of rack 10, cooling system 14, rails 16 and panel 18 can be used for each rack 10 of multiple racks that are adjacent to each other. The racks 10 can be arranged in different configurations according to space and layout constraints within the data center in which the racks 10 are located.

Figure 2:
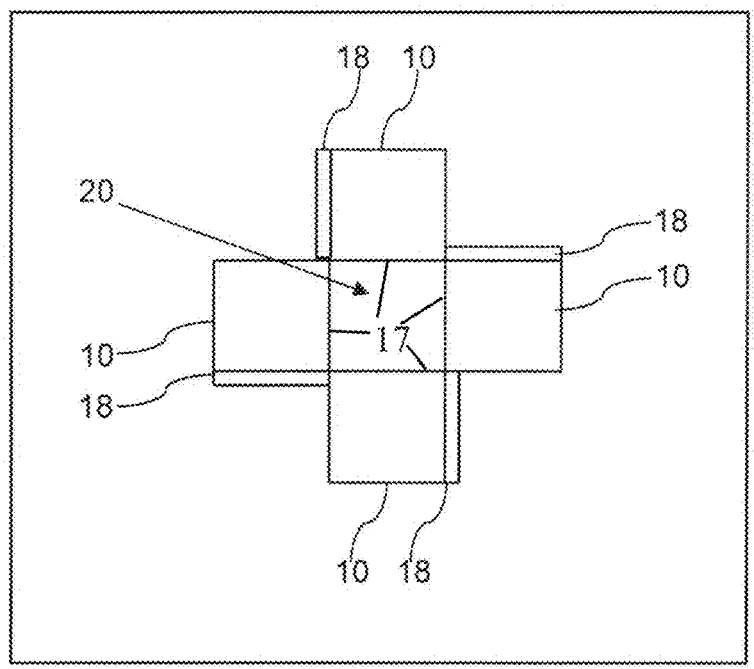
FIG. 2 depicts a schematic diagram of a top view of four racks, in accordance with embodiments of the present invention.

FIG. 2 depicts a schematic diagram of a top view of four racks 10, in accordance with embodiments of the present invention. The four racks 10 are arranged in a cruciform arrangement, when viewed from above, as in FIG. 2. The four racks 10, when viewed from above, have the rear 17 of each rack 10 facing the hot aisle 20 of the cruciform arrangement. Each rack 10 is provided with a respective panel 18.

In FIG. 2, the hot aisle 20 in the cruciform arrangement is a channel (or aisle) for hot air that is taken away from the four racks 10. The four racks 10 are positioned in an innovative and efficient way to cool the four racks 10 in a data center, to provide a useful way to manage and maintain the information technology (IT) resources in the racks 10. The four racks 10 are positioned in the cruciform arrangement in order to better cool the electronic components 12 and extract the hot air in such way that the hot air can be easily reused, while also providing easy access to the rear of the racks 10 that are storing the electronic components 12, without disturbing the operation of the hot aisle 20. The arrangement of the racks 10 helps to easily move the racks 10 in order to maintain the racks 10 for maintenance, installation and rework.

All of the racks 10 are positioned in order to confine the hot air expelled from the racks 10 in the hot aisle 20. In such a configuration, the hot air is compressed and is extracted through a chimney 26 (see FIG. 5) that is located above the hot aisle 20, in order to reuse the hot air efficiently. The rear 17 of each rack 10 defines a side wall of the hot aisle 20, and the chimney 26 above the hot aisle draws the hot air way from the hot aisle 20. When the air temperature of the hot air is higher than adjacent air, it is easier to transport the hot air. In order to access the back of the racks 10 for maintenance, while avoiding cold air migrating into the hot aisle 20, each rack 10 is placed on rails 16 to allow the rack 10 to move from back to front. Meanwhile, the movable panels 18 are deployed in order to fully close the hot aisle 20.

Each panel 18 is mounted on the side of an adjacent rack 10 and can be moved into position by an operator, before a rack 10 is moved on its rails 16. The other three racks 10 in the cruciform arrangement can all continue to function as normal, without any interruption, as the panel 18 closes off the hot aisle 20 from the rack 10 that is being moved. Thus, as the rack 10 is moved forward on its rail system 16, in order to access the rear 17 of the rack 10, the hot aisle 20 is still enclosed by the other racks 10 on three sides and by the panel 18 on the fourth side.

This arrangement of racks 10, in a cruciform arrangement, with the backs of the racks facing inwards to the hot aisle 20, provides an efficient method of cooling the racks 10, while also allowing the racks 10 to be maintained from the rear, without hot air being allowed to travel back into the cooler part of the data center. The cold conditions at the front of the racks 10 are unaffected, even when a rack 10 is moved forwards to gain access to the rear of the rack 10. The cold air is blocked from mixing with the hot air in the hot aisle 20 by the panel 18 which is moved across behind the rack 10 that is being moved, prior to the movement.

Figure 3:
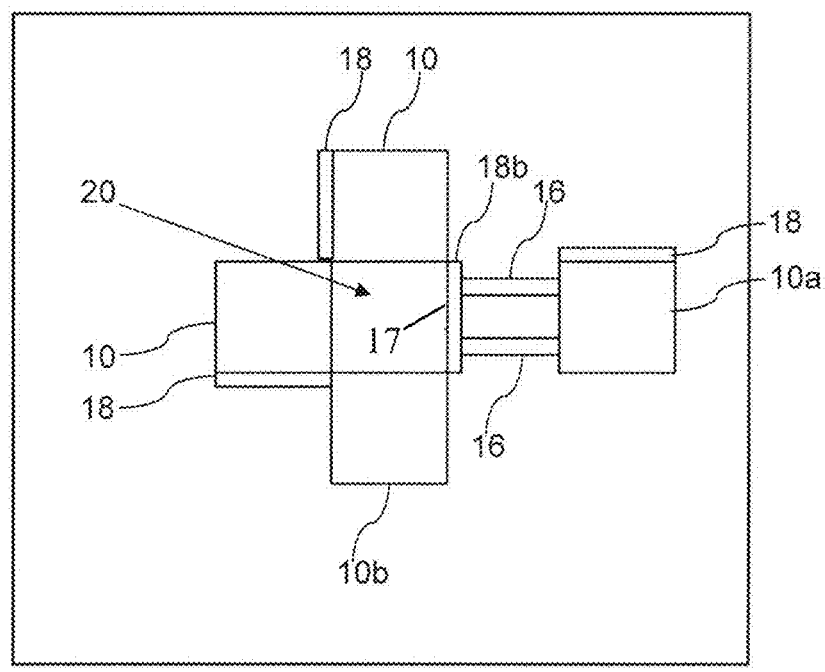
FIG. 3 depicts the schematic diagram of FIG. 2 with one of the racks having been moved forwards on its rails, in accordance with embodiments of the present invention.

FIG. 3 depicts the schematic diagram of FIG. 2, with one of the racks 10a having been moved forwards on its rails 16, in accordance with embodiments of the present invention. In these embodiments of the racks 10, the rails 16 are positioned underneath the racks 10, and the racks 10 can be easily moved by an operator within the data center. Prior to moving the rack 10a, the operator has slid the panel 18b across from an adjacent rack 10 to cover the rear 17 of the rack 10a. This movement of the panel 18b ensures that the hot aisle 20 at the back of the four racks 10 is maintained, even when the rack 10a is actually moved from its operational position to its non-operational position.

The cold air that is circulating around the front of the racks 10 cannot reach the hot aisle 20, even though the rack 10a has been moved forward. The panel 18b maintains a separation between the hot and cold air, which maintains the efficiency of the cooling operations of the remaining racks 10, while also maintaining the efficiency of the hot aisle 20, which draws away the hot air to the air conditioning for the hot air to be cooled and returned to the front of the racks 10 to be used for the cooling purposes. The operator can access the rear 17 of the rack 10a without disrupting the flow of hot and cold air in the data center.

The panel 18b is carried by an adjacent rack 10b, so that the design of each rack 10, in the configuration of FIGS. 2 and 3, is identical. Each rack 10 carries a panel 18 on one side, which can be slid backwards to block off the rear of an adjacent rack 10, which is why the arrangement shown in FIGS. 2 and 3 is efficient, since identical racks 10 can be used, while all of the racks 10 have the option to be moved forward with a panel 18 being used from an adjacent rack 10 to cover the rear 17 of the rack 10 that is being moved.

Figure 4:
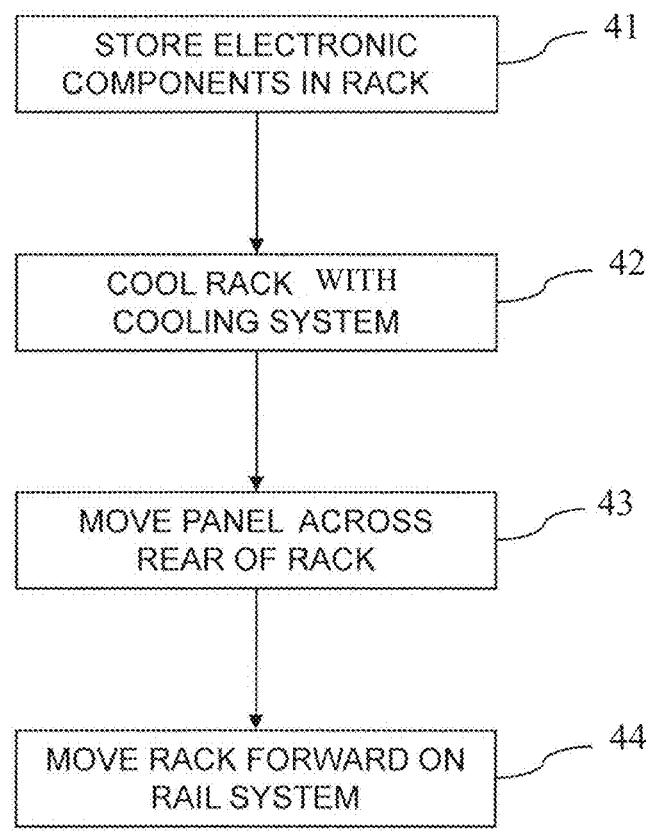
FIG. 4 is a flowchart of a method of cooling racks in a data center, in accordance with embodiments of the present invention.

FIG. 4 is a flowchart of a method of cooling racks 10 in a data center, in accordance with embodiments of the present invention. The method in FIG. 4 comprises steps 41-44. Step 41 stores electronic components 12 in the rack 10. Step 42 draws cold air into the rack 10 with a cooling system 14 connected to the rack 10 to cool the rack 10 of electronic components 12 and expel hot air from the rack 10 via the rear of the rack 10. Step 43 moves a panel 18 from a first position not blocking the rear 17 of the rack 10 to a second position blocking the rear 17 of the rack 10. Step 44 moves the rack 10 with a rail system 16 connected to the rack 10 from an operating position forward to a non-operating position.

In the configuration of FIGS. 2 and 3, there are four racks 10 located in a cruciform arrangement, when viewed from above, with the rear 17 of each rack 10 facing the hot aisle 20 of the cruciform arrangement. Each rack 10 mounts a panel 18 that is movable from a first position not blocking the rear 17 of an adjacent rack 10 to a second position blocking the rear 17 of the adjacent rack 10. Each of the racks 10 of the four racks 10 that are arranged in a cruciform arrangement, when viewed from above, is adjacent and directly connected to two other racks 10 of the four racks 10. Each rack 10 is individually mounted on a rail system 16 for moving the individual rack 10 forward and back.

An advantage of the arrangement of racks 10 shown in FIGS. 2 and 3 is that maintenance can be carried out on the rear 17 of an individual rack 10 without interfering with the normal operation of the other three racks 10 that make up the set of four racks 10. A panel 18 can be moved from a first position to a second position behind the specific rack 10 that is being moved, which isolates the rack 10 in question from the hot aisle 20 behind the rack 10. The rack 10 can then be moved forward on the rail system 16 in order to access the rear 17 of the rack 10.

Figure 5:
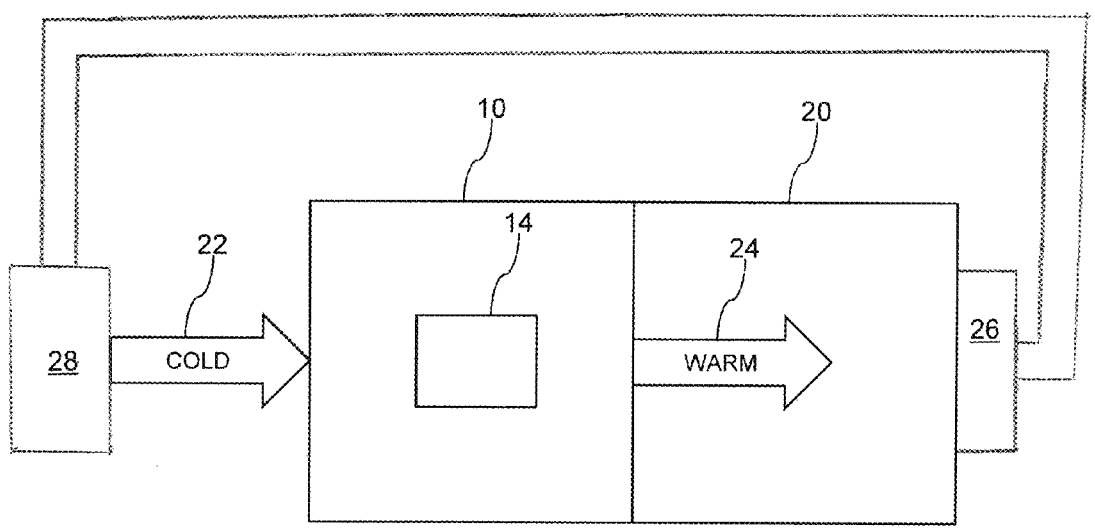
FIG. 5 is a schematic diagram of air flow in and out of a rack, viewed from above, in accordance with embodiments of the present invention.

FIG. 5 is a schematic diagram of air flow in and out of the rack 10, viewed from above, in accordance with embodiments of the present invention. Cold air 22 is drawn into the rack 10 for the purpose of cooling the electronic components 12 stored in the rack 10. The electronic components 12 generate heat during normal operation. The cold air 22 is drawn into the rack 10 by the cooling system 14, which could be a fan, for example. Although in one embodiment, the cooling system 14 is located inside the rack 10, the cooling system 14 could also be located outside the rack 10, but still connected to the rack 10, for example via suitable piping. Hot air 24 is then expelled from the rear of the rack 10 into the hot aisle 20.

In one embodiment in which a data center accommodates a large number of racks 10, the cooling of the racks 10 of electronic components 12 may be a significant concern in relation to the effectiveness of the cooling and to the amount of power that is required to be supplied to the cooling systems 14. The hot air 24 that is expelled from the rear of the rack 10 is drawn into a hot aisle 20 where the hot air 24 will be drawn upward into a chimney 26 connected to an air conditioning system 28 and directed to the air conditioning system 28. The air conditioning system 28 cools the hot air 24 and returns the cooled air back into an open part of the data center to once again be used as cold air 22 for cooling purposes.

The cooling system 14 that draws the cold air 22 into one rack 10 can be a dedicated cooling system 14 that supplies cold air 24 specifically for that one rack 10 and no other rack 10, or the cooling system 14 can be a more general arrangement that provides the cold air 22 to multiple racks 10 via pipes from the cooling system 14 to individual racks 10. For example, a single central cooling system 14 could be connected to four racks 10, with a single inflow of cold air 22, from the data center environment, that is pushed by a fan through the pipes into the four separate racks 10 and exits each rack 10 at the rear 17 of the respective rack 10 and into the hot aisle 20. In this embodiment, the cooling system of each rack 10 is connected to the central cooling system 14 to provide cold air 24 to the cooling system 14 of each individual rack 10.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others or ordinary skill in the art to understand the embodiments disclosed herein.

What is claimed is:

1. A system comprising four racks arranged in a cruciform arrangement having a center, when viewed from above, each rack having a front and a rear, with the rear of each rack facing a hot aisle at the center of the cruciform arrangement, wherein each rack comprises:
    a plurality of electronic components;
    one cooling system in the rack and arranged to draw cold air into the rack to cool the electronic components and expel hot air into the hot aisle from the rack via a rear of the rack which results in the hot air being exhausted from the hot aisle primarily by a mechanism of the hot air in the hot aisle having a higher temperature than adjacent air, said one cooling system in the rack being external to the electronic components in the rack;
    a panel, mounted on the rack, movable from an open position not blocking a rear of an adjacent rack to a closed position blocking the rear of the adjacent rack; and
    a rail system connected to the rack and configured to move, after the panel of the one rack has been moved from the open position to the closed position, the rack from an operating position forward to a non-operating position.

2. The system of claim 1, wherein each rack of the four racks that are arranged in a cruciform arrangement, when viewed from above, is adjacent and directly connected to two other racks of the four racks.

3. The system of claim 1, wherein the one cooling system of each rack is arranged to draw cold air from the front of the rack to cool the electronic components stored in each rack.

4. The system of claim 1, wherein the system further comprises a chimney above the hot aisle and an air condition system, wherein the chimney is connected to the air conditioning system, wherein the hot air is exhausted from the hot aisle through the chimney, wherein the hot air exhausted through the chimney is directed into the air conditioning system, and wherein the hot air in the air conditioning system is cooled in the air conditioning system and subsequently drawn into the one cooling system of each rack.

5. The system of claim 1, wherein the one cooling system of each rack is connected to a central cooling system arranged to provide cold air to the one cooling system of each rack.

6. A method, said method comprising:
    providing a system comprising four racks arranged in a cruciform arrangement having a center, when viewed from above, each rack comprising a plurality of electronic components, each rack having a front and a rear and a panel mounted thereon, with the rear of each rack facing a hot aisle at the center of the cruciform arrangement;
    drawing cold air into each rack, via one cooling system in each rack, to cool the electronic components in each rack, and expelling hot air into the hot aisle from each rack via the rear of each rack which results in the hot air being exhausted from the hot aisle primarily by a mechanism of the hot air in the hot aisle having a higher temperature than adjacent air, said one cooling system in each rack being external to the electronic components in each rack;
    moving a panel of one rack of the four racks, from an open position not blocking the rear of an adjacent rack to a closed position blocking the rear of the adjacent rack; and
    after said moving the panel of the one rack from the open position to the closed position, moving the adjacent rack from an operating position forward to a non-operating position with a rail system connected to the adjacent rack.

7. The method of claim 6, wherein each rack of the four racks that are arranged in a cruciform arrangement, when viewed from above, is adjacent and directly connected to two other racks of the four racks.

8. The method of claim 6, wherein the one cooling system of each rack is arranged to draw cold air from the front of the rack to cool the electronic components stored in each rack.

9. The method of claim 6, wherein the system further comprises a chimney above the hot aisle and an air condition system, and wherein the method comprises:
- exhausting the hot air from the hot aisle through the chimney;
- directing, into the air conditioning system, the hot air exhausted through the chimney; and
- cooling, by the air conditioning system, the hot air in the air conditioning system and subsequently drawing the cooled hot air into the cooling system of each rack.

10. The method of claim 6, wherein the one cooling system of each rack is connected to a central cooling system arranged to provide cold air to the one cooling system of each rack.

\* \* \* \* \*